(12) United States Patent
Sagayanathan et al.

(10) Patent No.: US 7,045,720 B2
(45) Date of Patent: May 16, 2006

(54) COMPONENT LEAD SYSTEM

(75) Inventors: Clement Sagayanathan, Kedah (MY); Paribalan Suntharalingam, Perak (MY)

(73) Assignee: Intel Corporation, Santa Clara, CA (US)

( * ) Notice: Subject to any disclaimer, the term of this patent is extended or adjusted under 35 U.S.C. 154(b) by 126 days.

(21) Appl. No.: 10/665,594

(22) Filed: Sep. 19, 2003

(65) Prior Publication Data

US 2005/0061543 A1    Mar. 24, 2005

(51) Int. Cl.
*H01R 12/04*    (2006.01)
*H05K 1/11*    (2006.01)

(52) U.S. Cl. .......................... 174/267; 29/844; 29/837; 361/773; 174/260

(58) Field of Classification Search ................ 174/260, 174/267; 361/773; 257/735; 29/837–839, 29/844, 845
See application file for complete search history.

(56) References Cited

U.S. PATENT DOCUMENTS

| | | | | |
|---|---|---|---|---|
| 3,228,091 A | * | 1/1966 | Rice et al. | 29/832 |
| 3,747,045 A | * | 7/1973 | Stross | 439/55 |
| 3,880,493 A | * | 4/1975 | Lockhart, Jr. | 439/525 |
| 3,963,316 A | * | 6/1976 | Williams | 439/82 |
| 5,096,425 A | * | 3/1992 | Takahashi | 439/55 |
| 5,160,270 A | * | 11/1992 | Reymond | 439/70 |
| 6,010,342 A | * | 1/2000 | Watson | 439/78 |
| 6,296,509 B1 | * | 10/2001 | Leung et al. | 439/362 |
| 6,617,522 B1 | * | 9/2003 | Tabacutu | 174/260 |
| 6,898,085 B1 | * | 5/2005 | Haba et al. | 361/760 |

* cited by examiner

*Primary Examiner*—Kamand Cuneo
*Assistant Examiner*—Jeremy Norris
(74) *Attorney, Agent, or Firm*—Buckley, Maschoff & Talwalkar LLC (57) ABSTRACT

A system may include an electronic component body, and one or more leads coupled to and extending from the electronic component body. A first lead of the one or more leads may comprise a first leg and a second leg, the first leg and the second leg defining an acute angle therebetween.

11 Claims, 12 Drawing Sheets

COMPONENT LEAD SYSTEM

BACKGROUND

Many techniques exist for mounting electronic components to a substrate. According to some techniques, leads of an electronic component are inserted into "through holes" within the substrate. Next, the leads may be soldered to appropriate conductive elements of the substrate.

The substrate may be manipulated after the leads are inserted therein and before the leads are soldered thereto. This manipulation, which may include lifting, conveying, or sliding, may cause the leads to dislodge from the through holes. Accordingly, conventional systems utilize jigs designed to maintain the leads within respective through holes until soldering is completed. A jig may be mounted to the substrate and plungers may be mounted in the jig so as to hold electronic components in proper position on the substrate.

DETAILED DESCRIPTION

Figure 1:
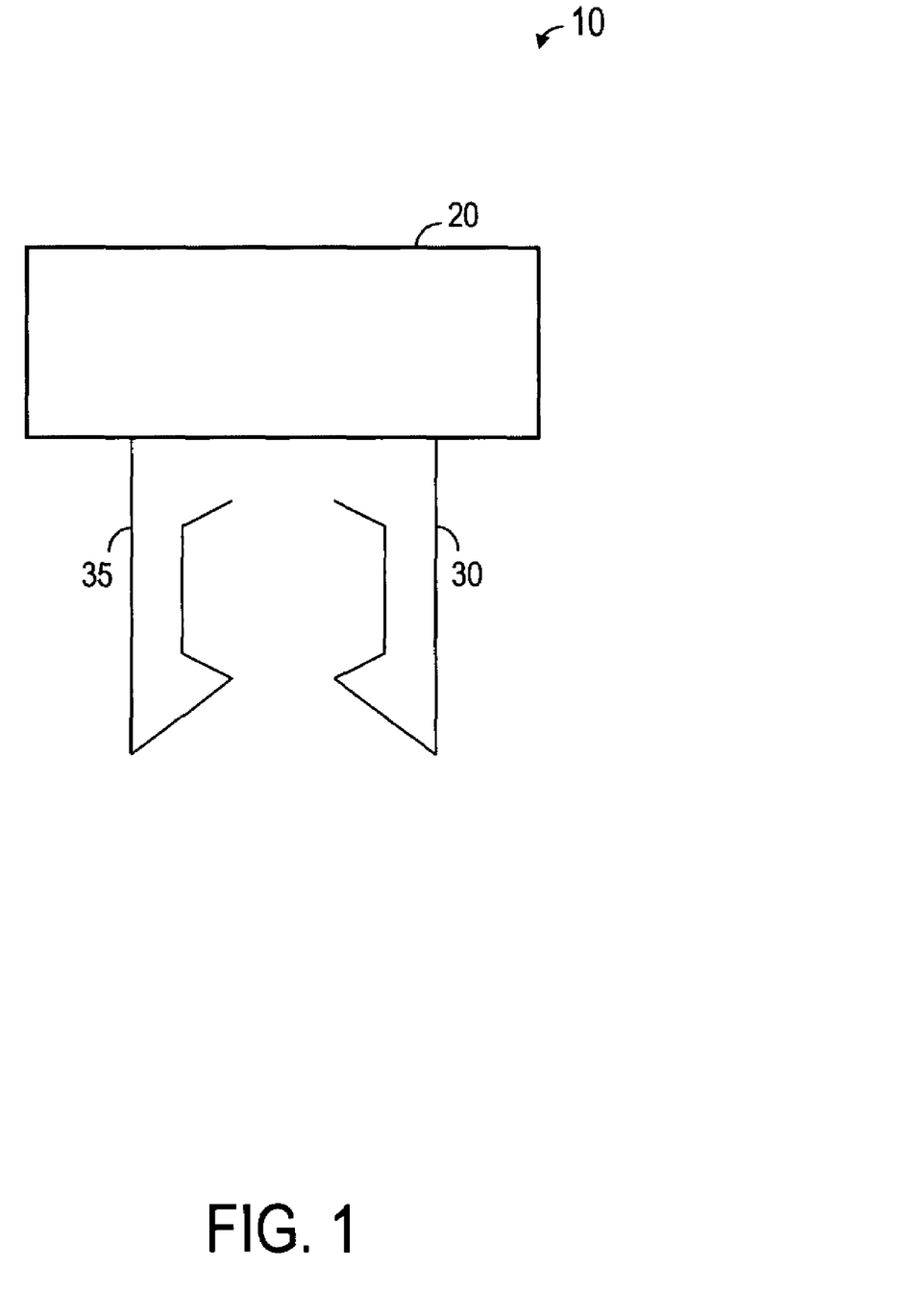
FIG. 1 is a side elevation of an apparatus according to some embodiments.

FIG. 1 is a side elevational view of apparatus 10 according to some embodiments. Apparatus 10 may comprise any electronic component suitable for use in conjunction with some embodiments. Non-exhaustive examples of such an electronic component may include an electrolytic capacitor, a resistor, an inductor, and a transistor. Apparatus 10 may therefore comprise any combination of one or more active and/or passive electronic devices.

Apparatus 10 includes body 20 and leads 30 and 35. Body 20 may comprise any materials suitable to provide the desired functionality of apparatus 10. Body 20 may comprise several components made of one or more materials and/or a single material. Body 20 may comprise any currently- or hereafter-known electronic component bodies in accordance with some embodiments.

Leads 30 and 35 comprise conductive material. One or both of leads 30 and 35 may comprise a tin-coated conductor. Each of leads 30 and 35 extends from and is coupled to body 20. Some embodiments are not limited to two leads as shown in FIG. 1. For example, embodiments may include one, three, or more leads, and one or more leads may comprise conventional leads and/or leads other than those generally described herein. In some embodiments, one or both of leads 30 and 35 are to be inserted into an opening of a substrate so as to substantially prevent movement of apparatus 10 perpendicular to the substrate.

Figure 2:
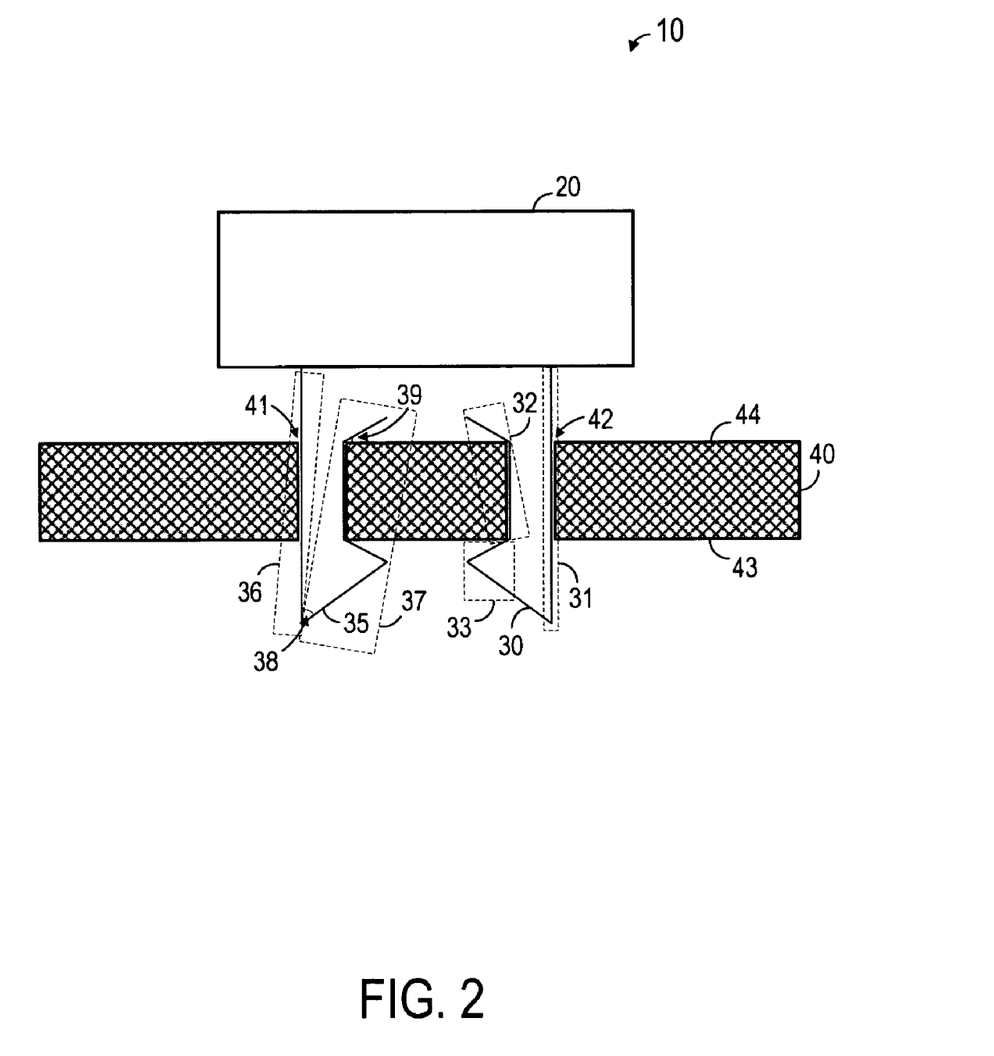
FIG. 2 is a side elevation of an apparatus coupled to a substrate according to some embodiments.

FIG. 2 shows apparatus 20 mounted on substrate 40 according to some embodiments. Substrate 40 may comprise FR4 circuit board material or any other suitable material. Substrate 40 defines openings 41 and 42, described above as through holes. First side 43 of substrate 40 may comprise conductors (not shown) that are adjacent to one or both of openings 41 and 42. Accordingly, items inserted into openings 41 and 42 may be soldered to the adjacent conductors to electrically couple the items to substrate 40. Conductors may also or alternatively be disposed adjacent to openings 41 and/or 42 on second side 44 of substrate 40.

Leads 30 and 35 may prevent movement of apparatus 10 perpendicular to substrate 40 according to some embodiments. As shown in FIG. 2, leads 30 and 35 are secured to first side 43 and second side 44 by virtue of their configuration. More particularly, lead 30 includes first portion 31 in contact with body 20, second portion 32 comprising an end of lead 30, and third portion 33 between portions 31 and 32. A portion of first portion 31 resides in opening 42, a portion of second portion 32 also resides in opening 42, and a portion of third portion 33 contacts first side 43 of substrate 40. Although FIG. 2 shows small gaps between leads 30 and 35 and the inner walls of openings 41 and 42, leads 30 and/or 35 may also press against the inner walls to create additional coupling force according to some embodiments. The above may apply to other lead-substrate gaps illustrated herein.

A second portion of second portion 32 also contacts second side 44 of substrate 40. Such a feature may allow body 20 to be disposed away from substrate 40 while apparatus 10 remains secured to substrate 40. Such embodiments may provide cooling of body 20 by air flowing between body 20 and substrate 40. First portion 31, second portion 32, and third portion 33 are not limited to the areas of lead 30 defined by dotted lines in FIG. 2. This statement may apply to other lead portions illustrated and described herein. For example, a portion may include more or less of its respective lead than illustrated.

Lead 35 comprises first leg 36 and second leg 37. As shown, first leg 36 and second leg 37 define acute angle 38 therebetween. Second leg 37 includes a first portion that is coupled to first leg 36 and a second portion substantially parallel to first leg 36. Second leg 37 also includes a third portion that defines obtuse angle 39 with the second portion of second leg 37. As shown, a length of the second portion is substantially equal to a thickness of substrate 40. One or more of the features of lead 35 may assist in securing apparatus 10 to substrate 40.

Figure 3:
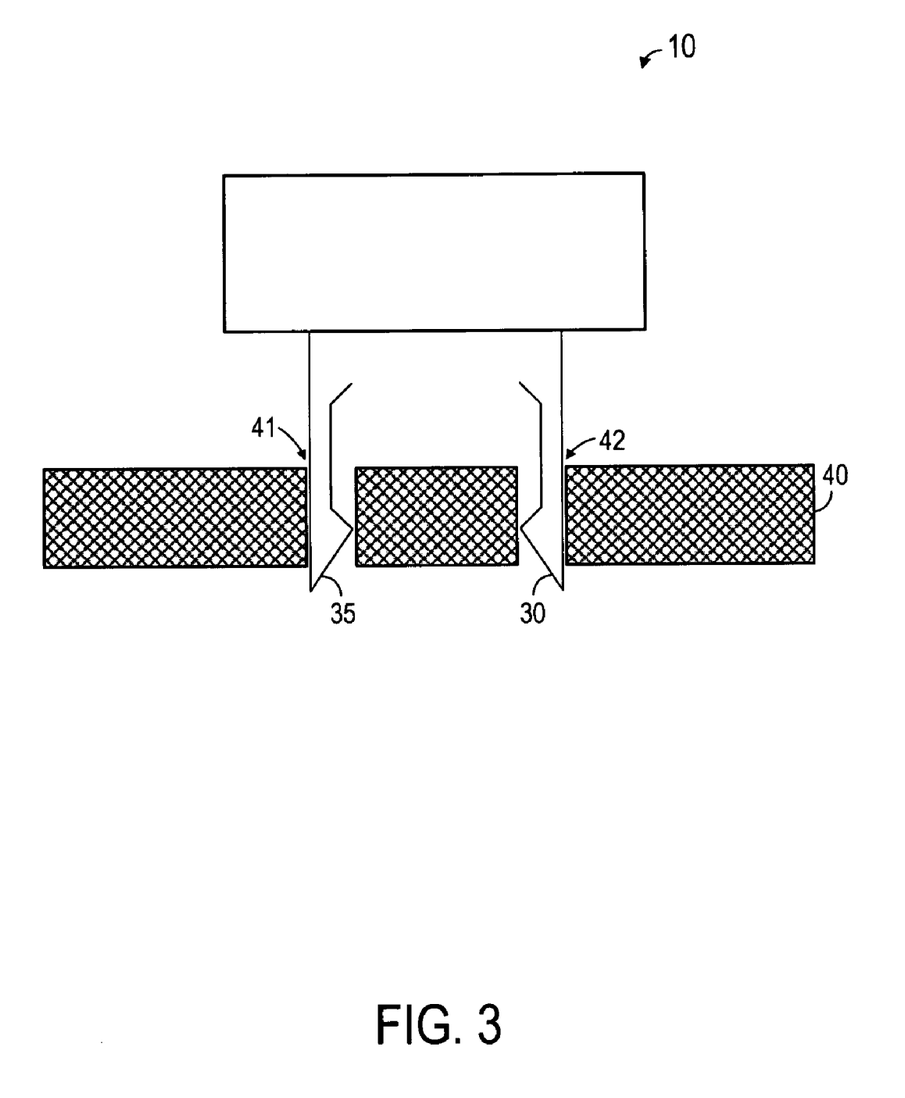
FIG. 3 is a side elevation of an apparatus being coupled to a substrate according to some embodiments.

FIG. 3 illustrates apparatus 10 being coupled to substrate 40 according to some embodiments. Leads 30 and 35 are placed and pressed into openings 41 and 42 and are thereby compressed due to their geometry and composition. Coupling is complete once leads 30 and 35 reach the positions shown in FIG. 2. Coupling may proceed manually and/or using automated equipment such as a mounter. Thereafter, leads 30 and 35 may be soldered to conductive contacts adjacent to openings 41 and 42, respectively, by transporting substrate 40 to and conveying substrate 40 through a wave soldering machine.

Figure 4:
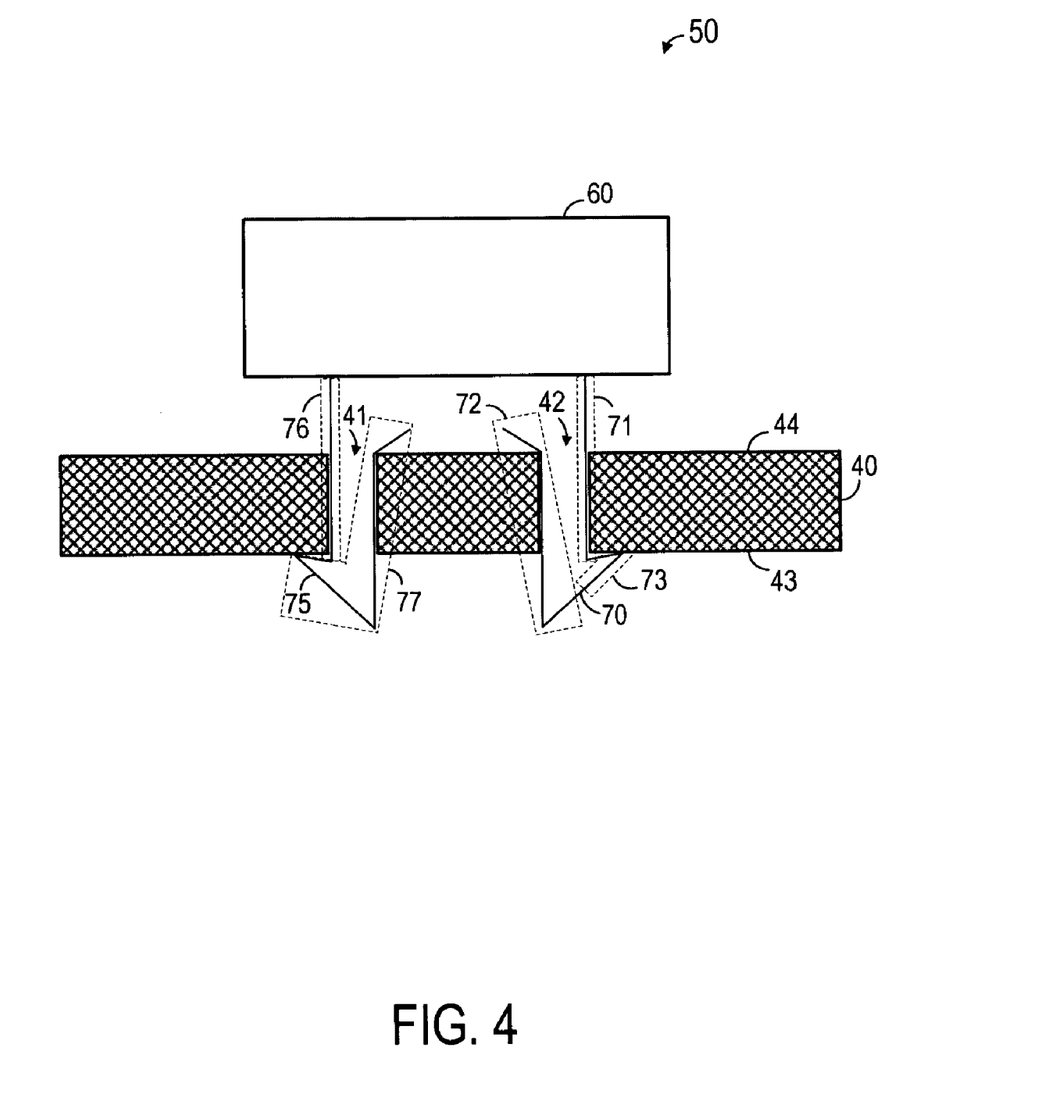
FIG. 4 is a side elevation of an apparatus coupled to a substrate according to some embodiments.

FIG. 4 shows apparatus 50 coupled to substrate 40 according to some embodiments. Apparatus 50 includes body 60 and leads 70 and 75. Body 60 may be identical to body 20 or may comprise any other electronic component body.

Leads 70 and 75 may also prevent movement of apparatus 50 perpendicular to substrate 40. Lead 70 includes first portion 71 in contact with body 60, second portion 72 comprising an end of lead 70, and third portion 73 between portions 71 and 72. A portion of first portion 71 resides in opening 42, a portion of second portion 72 also resides in opening 42, and a portion of third portion 73 contacts first side 43 of substrate 40. A second portion of second portion 72 contacts second side 44 of substrate 40, possibly to provide cooling of body 60.

Lead 75 comprises first leg 76 and second leg 77. As shown, first leg 76 and second leg 77 define an acute angle therebetween. Second leg 77 includes a first portion that is coupled to first leg 76 and a second portion substantially parallel to first leg 76. Second leg 77 also includes a third portion that defines an obtuse angle with the second portion of second leg 77. A length of the second portion is substantially equal to a thickness of substrate 40.

Figure 5:
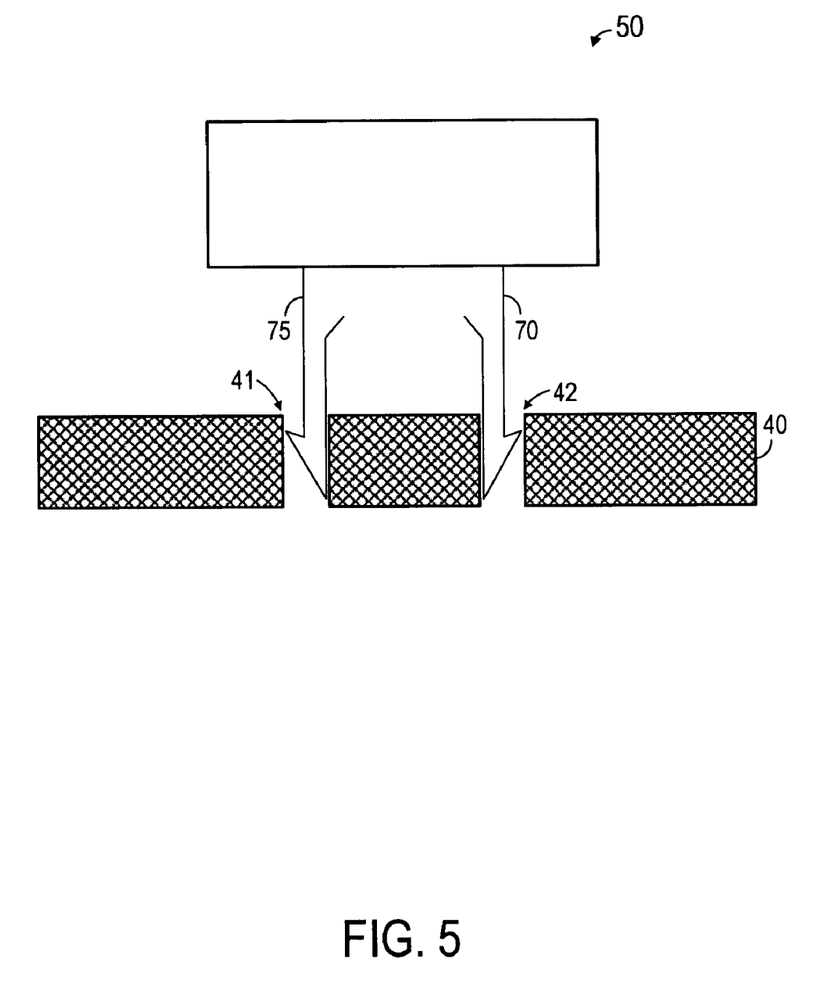
FIG. 5 is a side elevation of the FIG. 4 apparatus being coupled to a substrate according to some embodiments.

FIG. 5 illustrates apparatus 50 being coupled to substrate 40 according to some embodiments. Leads 70 and 75 are placed and pressed into openings 41 and 42 and are compressed thereby. Coupling as well as any further processing may proceed as described with respect to FIG. 3.

Figure 6:
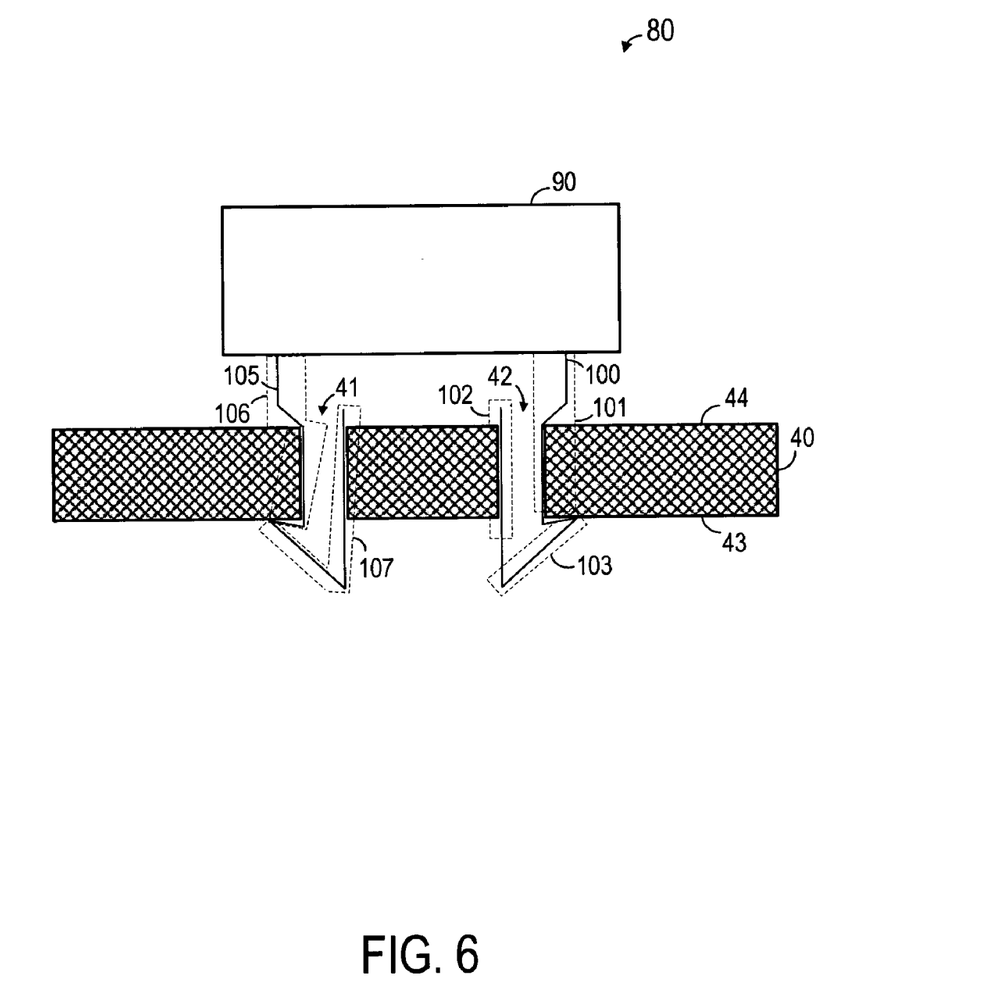
FIG. 6 is a side elevation of an apparatus coupled to a substrate according to some embodiments.

FIG. 6 illustrates apparatus 80 and substrate 40 according to some embodiments. Apparatus 80 includes electronic component body 90 and leads 100 and 105. Lead 100 includes first portion 101 in contact with body 90, second portion 102 comprising an end of lead 100, and third portion 103 between portions 101 and 102. A portion of first portion 101 resides in opening 42, a portion of second portion 102 also resides in opening 42, and a portion of third portion 103 contacts first side 43 of substrate 40.

Lead 105 comprises first leg 106 and second leg 107, which define an acute angle therebetween. Second leg 107 includes a first portion that is coupled to first leg 106 and a second portion substantially parallel to first leg 106. A length of the second portion is substantially equal to a thickness of substrate 40.

Figure 7:
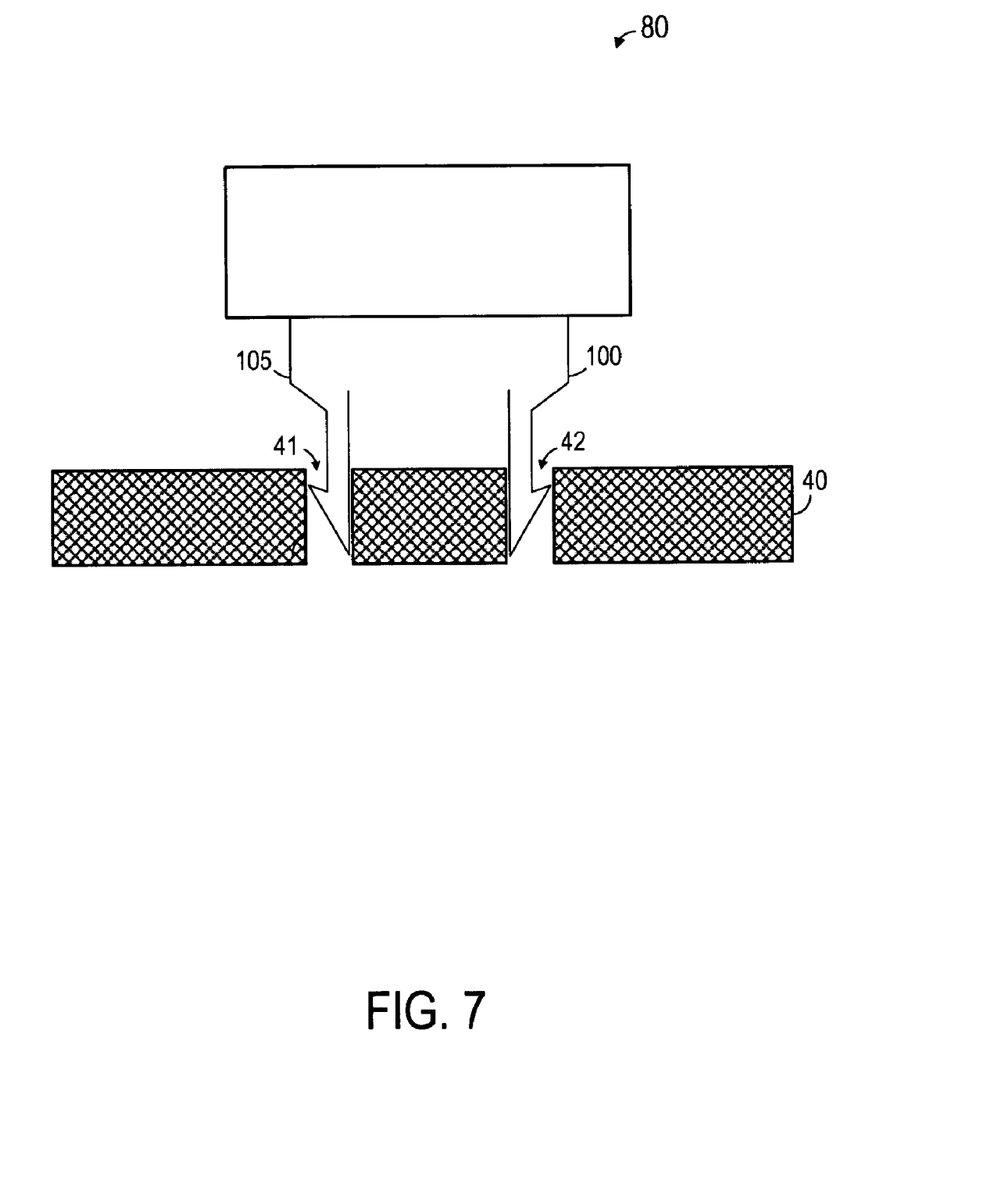
FIG. 7 is a side elevation of the FIG. 6 apparatus being coupled to a substrate according to some embodiments.

FIG. 7 illustrates apparatus 80 being coupled to substrate 40 according to some embodiments. Leads 100 and 105 are shown after being placed and pressed into openings 41 and 42. Leads 100 and 105 are compressed thereby, and further processing of substrate 40 may proceed as described with respect to FIG. 3.

Figure 8:
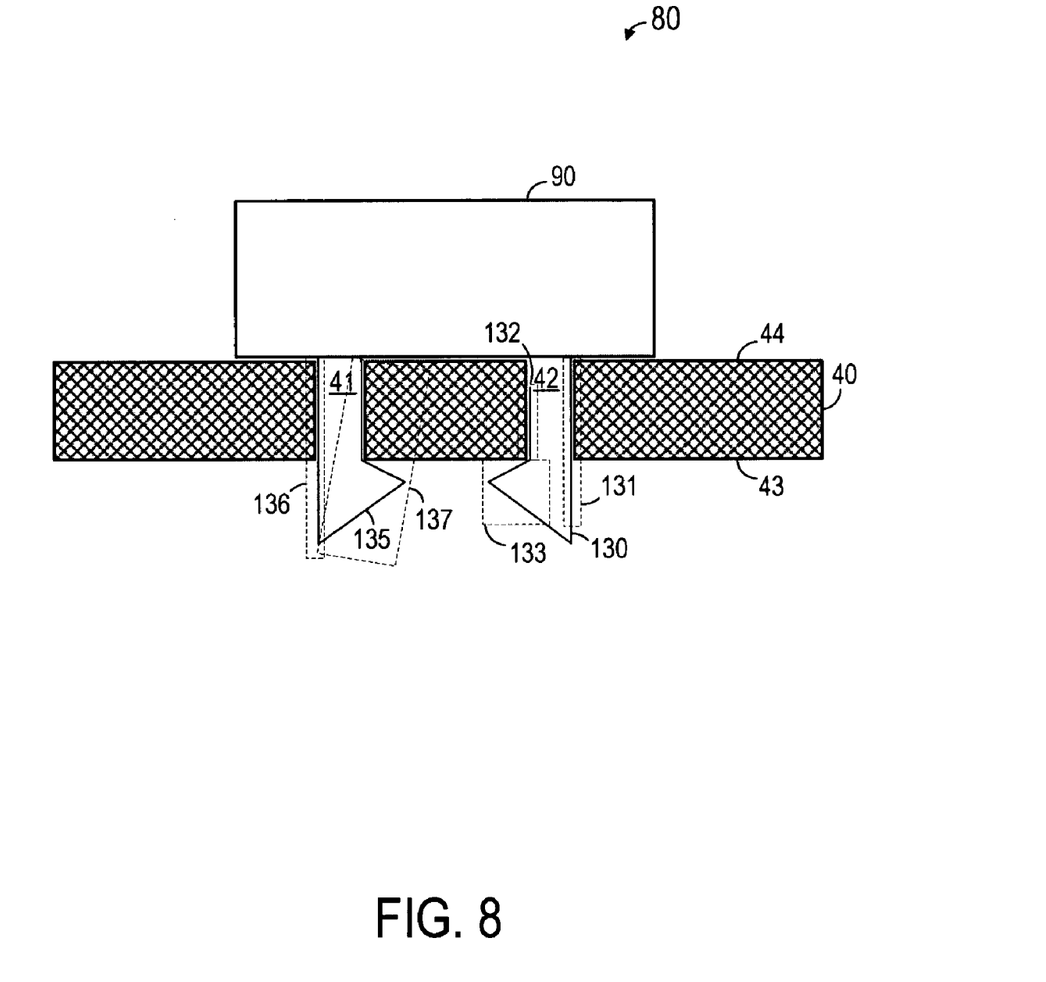
FIG. 8 is a side elevation of an apparatus coupled to a substrate according to some embodiments.

FIG. 8 illustrates apparatus 110 and substrate 40 according to some embodiments. Apparatus 110 includes electronic component body 120 and leads 130 and 135. Lead 130 includes first portion 131 in contact with body 120, second portion 132 comprising an end of lead 130, and third portion 133 between portions 131 and 132. A portion of first portion 131 resides in opening 42, a portion of second portion 132 also resides in opening 42, and a portion of third portion 103 contacts first side 43 of substrate 40.

Lead 135 comprises first leg 136 and second leg 137, which define an acute angle therebetween. Second leg 137 includes a first portion that is coupled to first leg 136 and a second portion substantially parallel to first leg 136. Moreover, body 120 contacts second side 44 of substrate 40. Such contact may assist in securing apparatus 110 to substrate 40 in some embodiments.

Figure 9:
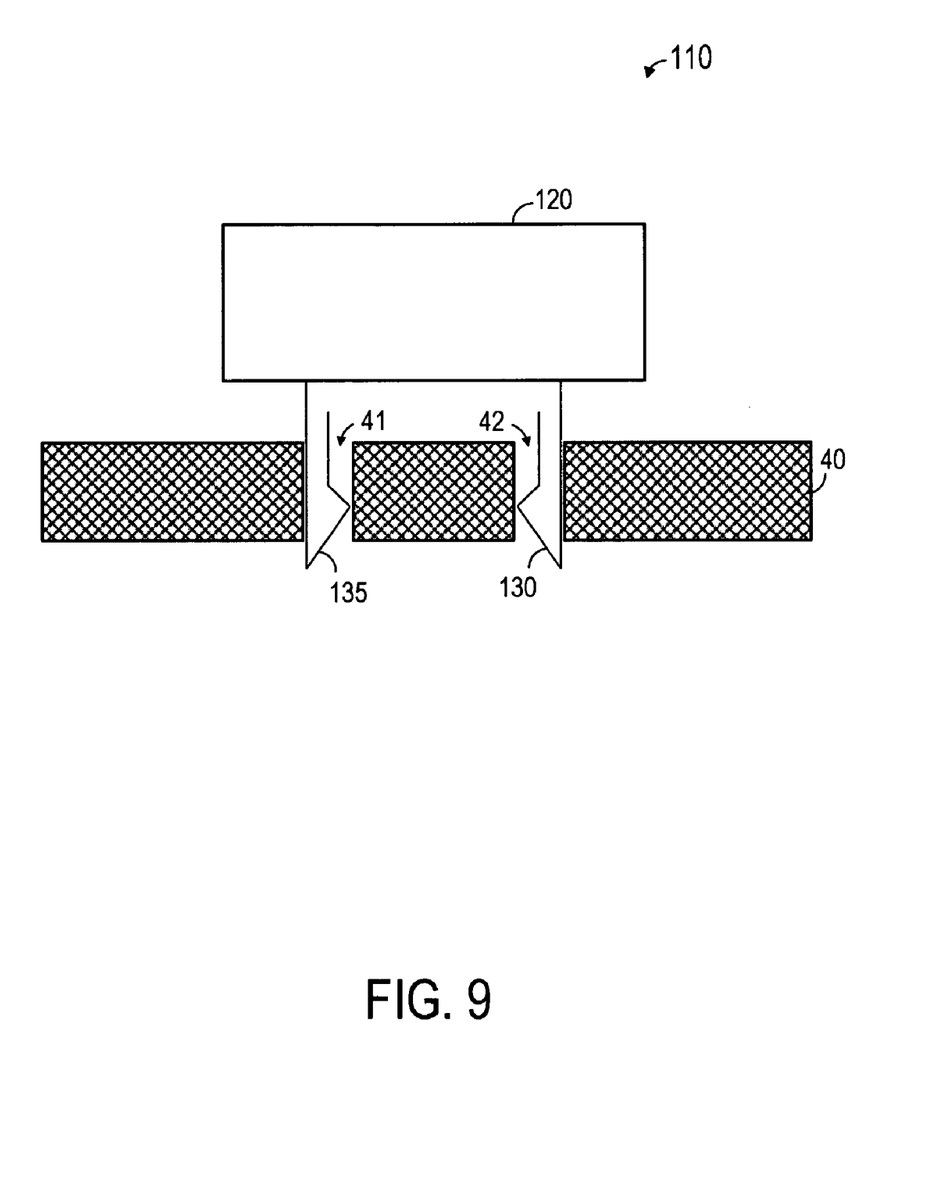
FIG. 9 is a side elevation of the FIG. 8 apparatus being coupled to a substrate according to some embodiments.

FIG. 9 illustrates apparatus 110 being coupled to substrate 40 according to some embodiments. Leads 130 and 135 are shown after being placed and pressed into openings 41 and 42. Leads 130 and 135 are compressed thereby until a position shown in FIG. 8 is reached, and further processing of substrate 40 may proceed as described with respect to FIG. 3.

Figure 10:
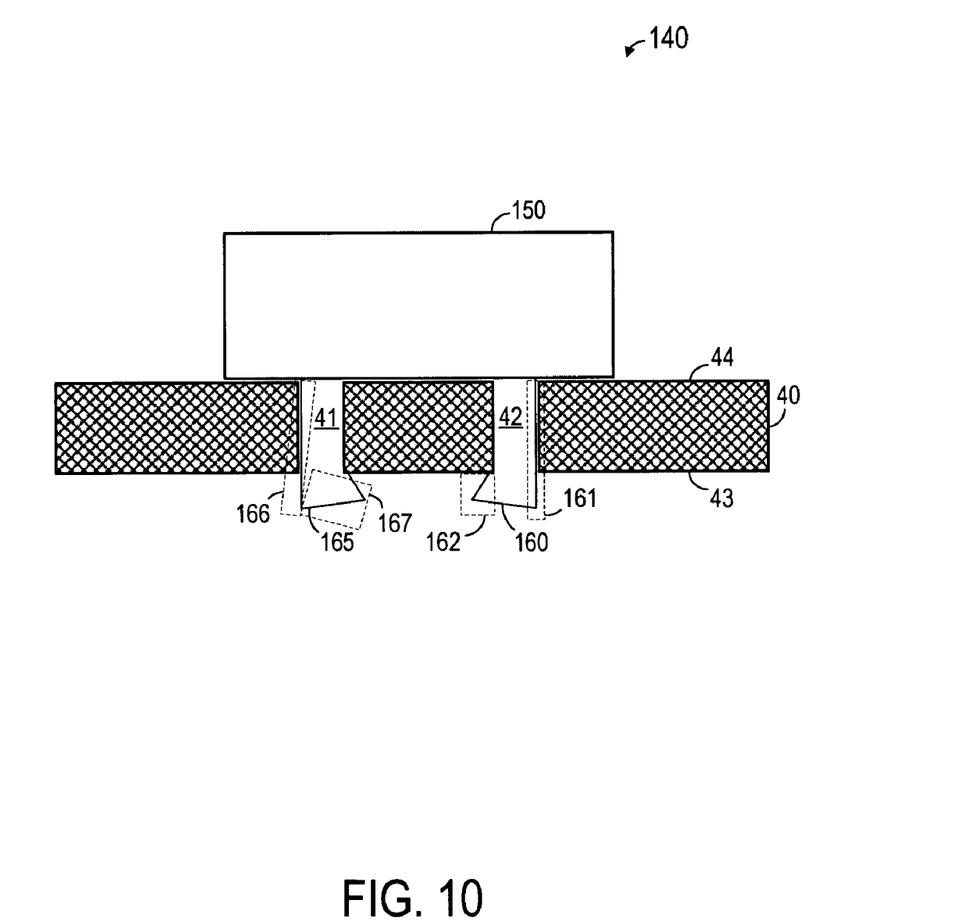
FIG. 10 is a side elevation of an apparatus coupled to a substrate according to some embodiments.

FIG. 10 illustrates apparatus 140 and substrate 40 according to some embodiments. Apparatus 140 includes electronic component body 150 and leads 160 and 165. Leads 160 and 165 may substantially prevent movement of apparatus 140 perpendicular to substrate 40. Lead 160 includes first portion 161 in contact with body 150, and second portion 162 comprising an end of lead 160. A portion of first portion 161 resides in opening 42, and a portion of second portion 162 contacts first side 43 of substrate 40.

Lead 165 comprises first leg 166 and second leg 167, which define an acute angle therebetween. A portion of second leg 167 contacts first side 43 of substrate 40. Body 150 contacts second side 44 of substrate 40, and may thereby assist in securing apparatus 140 to substrate 40 in some embodiments.

Figure 11:
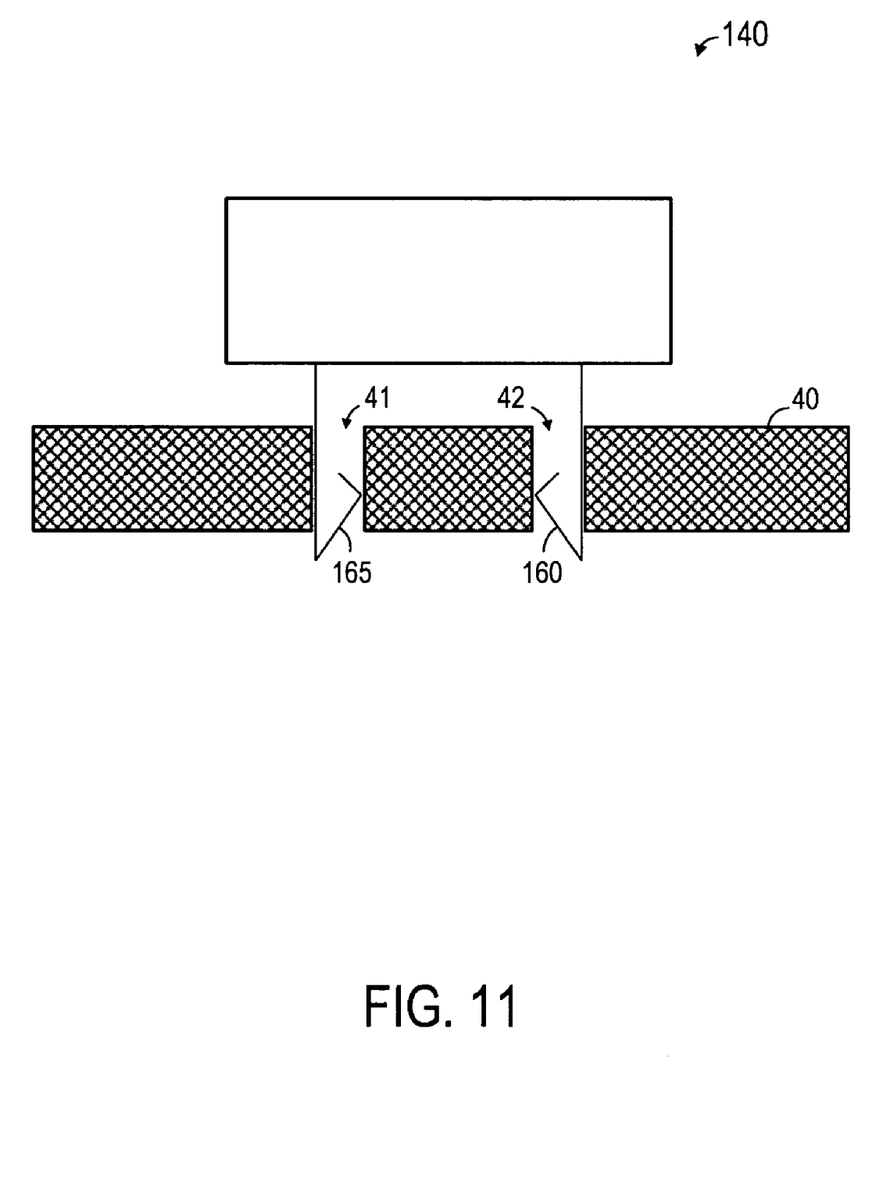
FIG. 11 is a side elevation of the FIG. 10 apparatus being coupled to a substrate according to some embodiments.

FIG. 11 illustrates apparatus 140 being coupled to substrate 40 according to some embodiments. Leads 160 and 165 are shown as they are pressed into openings 41 and 42. Leads 160 and 165 are therefore compressed until a position shown in FIG. 10 is reached, and further processing of substrate 40 may proceed as described with respect to FIG. 3.

One or more of the above-described apparatuses may be fabricated by fabricating an electronic component body, by fabricating one or more leads as described above, and by electrically coupling the one or more leads to the body. During their fabrication, the leads may be bent manually and/or using a lead prepping machine. In some embodiments, an apparatus is fabricated comprising a body and one or more substantially straight leads. One or more of the straight leads are then bent as described above.

According to some embodiments, an electronic component body lead is bent to form a first leg and a second leg, the first leg and the second leg defining an acute angle therebetween. The second leg may be bent to form a first portion defining the acute angle with the first leg, and a second portion substantially parallel to the first leg. The second leg may be further bent to form a third portion defining an obtuse angle with the second portion.

Figure 12:
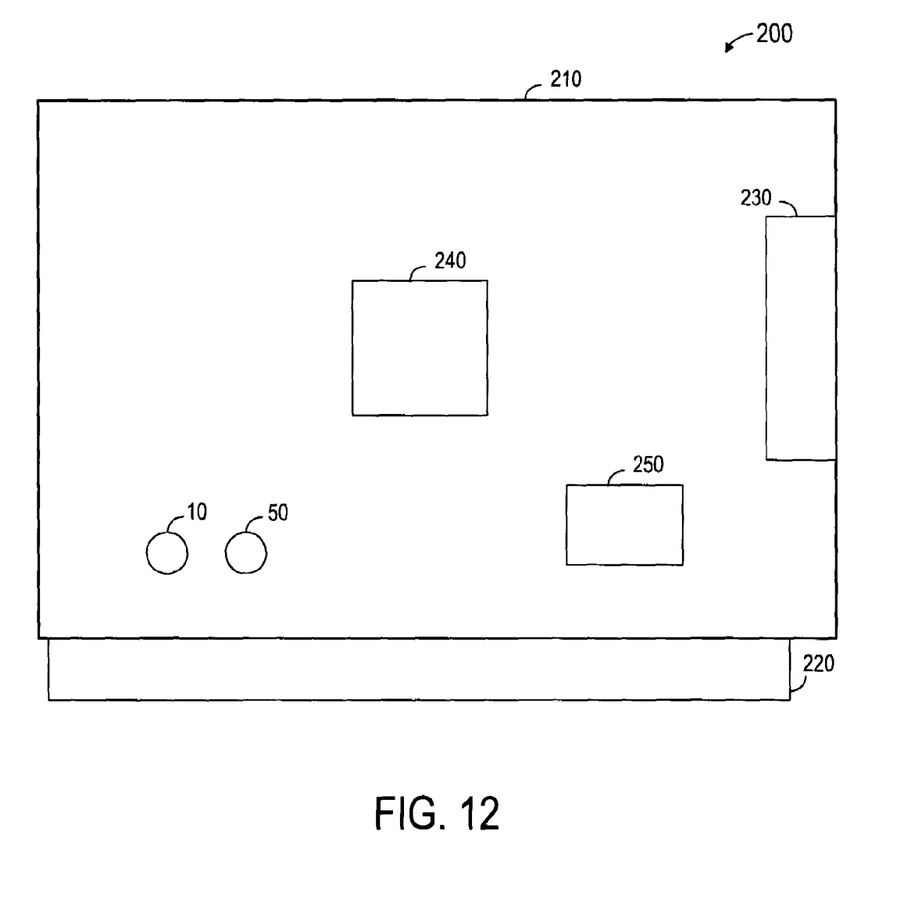
FIG. 12 is a diagram of a system according to some embodiments.

FIG. 12 is a diagram of system 200 according to some embodiments. System 200 may comprise an expansion card such as a modem card, a network interface card, a video driver card, or other type of card. System 200 includes circuit board 210, which may comprise multilayer FR4 material with embedded conductive paths. Apparatus 10 and apparatus 50 as described with respect to FIGS. 2 and 4 are coupled to circuit board 210. Connector 220 is coupled to circuit board 210. Connector 220 may comprise a Peripheral Component Interconnect Local Bus Specification Revision 2.3.-compliant connector to couple system 200 to a similarly-compliant motherboard. In other embodiments, apparatus 10 and apparatus 50 may be coupled directly to the motherboard. Also shown are interface 230 for interfacing with external devices, controller 240 for controlling functions provided by system 200, and memory 250 for assisting in the function of system 200.

The several embodiments described herein are solely for the purpose of illustration. The various features described herein need not all be used together, and any one or more of those features may be incorporated in a single embodiment. Some embodiments may include any currently or hereafter-known versions of the elements described herein. Therefore, persons skilled in the art will recognize from this description that other embodiments may be practiced with various modifications and alterations.

What is claimed is:

1. An apparatus comprising:
   an electronic component body; and
   one or more leads coupled to and extending from the electronic component body,
   wherein a first lead of the one or more leads comprises a first leg and a second leg, the first leg and the second leg defining a first acute angle therebetween, the second leg comprising a first portion defining the first acute angle with the first leg, a second portion defining a second acute angle with the first portion, a third portion defining a first obtuse angle with the second portion, and a fourth portion defining a second obtuse angle with the third portion,
   wherein the third portion is substantially parallel to the first leg,
   wherein a length of the third portion that is substantially parallel to the first leg is substantially equal to a thickness of a substrate to which the electronic component body is to be mounted,
   wherein a vertex of the first obtuse angle is to abut the substrate, and
   wherein the substrate is to be disposed between the vertex and the electronic component body.

2. An apparatus according to claim 1, wherein the first lead is tin-coated.

3. A method comprising:
   bending an electronic component body lead to form a first leg and a second leg, the first leg and the second leg defining a first acute angle therebetween; and
   bending the second leg to form a first portion defining the first acute angle with the first leg, a second portion defining a second acute angle with the first portion, a third portion defining a first obtuse angle with the second portion, and a fourth portion defining a second obtuse angle with the third portion,
   wherein the third portion is substantially parallel to the first leg,
   wherein a vertex of the first obtuse angle is to abut the substrate,
   wherein the substrate is to be disposed between the vertex and the electronic component body, and
   wherein a length of the third portion that is substantially parallel to the first leg is substantially equal to a thickness of a substrate to which the electronic component body is to be mounted.

4. A method according to claim 3, further comprising:
   electrically coupling the lead to an electronic component body.

5. A method according to claim 3, wherein the lead is attached to an electronic component body.

6. A method according to claim 3, wherein the electronic component body lead is tin-coated.

7. A method comprising:
   placing a lead of an electronic component body into an opening of a substrate, wherein the lead comprises a first leg and a second leg defining a first acute angle therebetween, the second leg comprising a first portion defining the first acute angle with the first leg, a second portion defining a second acute angle with the first portion, a third portion defining a first obtuse angle with the second portion, and a fourth portion defining a second obtuse angle with the third portion,
   wherein the third portion is substantially parallel to the first leg,
   wherein a vertex of the first obtuse angle is to abut the substrate,
   wherein the substrate is to be disposed between the vertex and the electronic component body, and
   wherein a length of the third portion that is substantially parallel to the first leg is substantially equal to a thickness of the substrate.

8. A method according to claim 7, further comprising:
   electrically coupling the lead to the substrate.

9. A method according to claim 7, wherein the lead of the electronic component body is tin-coated.

10. An expansion card comprising:
    a circuit board;
    a connector coupled to the circuit board, the connector to connect to a motherboard; and
    an electronic component body coupled to the circuit board, the electronic component body comprising one or more leads coupled to and extending from the electronic component body,
    wherein a first lead of the one or more leads comprises a first leg and a second leg, the first leg and the second leg defining a first acute angle therebetween, the second leg comprising a first portion defining the first acute angle with the first leg, a second portion defining a second acute angle with the first portion, a third portion defining a first obtuse angle with the second portion, and a fourth portion defining a second obtuse angle with the third portion,
    wherein the third portion is substantially parallel to the first leg,
    wherein a vertex of the first obtuse angle is to abut the substrate,
    wherein the substrate is to be disposed between the vertex and the electronic component body, and
    wherein a length of the third portion that is substantially parallel to the first leg is substantially equal to a thickness of the circuit board.

11. An expansion card according to claim 10, wherein the first lead is tin-coated.

* * * * *